United States Patent
Zhang et al.

(10) Patent No.: US 10,790,819 B1
(45) Date of Patent: Sep. 29, 2020

(54) POWER SWITCH CONTROL

(71) Applicant: ABB Schweiz AG, Baden (CH)

(72) Inventors: Yuzhi Zhang, Apex, NC (US); Utkarsh Raheja, Raleigh, NC (US); Pietro Cairoli, Cary, NC (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/801,557

(22) Filed: Feb. 26, 2020

(51) Int. Cl.
```
H03K 17/08     (2006.01)
H03K 17/567    (2006.01)
H02H 3/00      (2006.01)
H02H 5/00      (2006.01)
H03K 17/687    (2006.01)
H03K 17/735    (2006.01)
```

(52) U.S. Cl.
CPC ......... *H03K 17/687* (2013.01); *H03K 17/735* (2013.01)

(58) Field of Classification Search
CPC .......................... H03K 17/687; H03K 17/735
See application file for complete search history.

(56) References Cited

U.S. PATENT DOCUMENTS

| | | | | |
|---|---|---|---|---|
| 4,701,645 | A * | 10/1987 | Ferguson | H03K 5/1536 327/428 |
| 4,736,268 | A * | 4/1988 | Wagoner | H03K 17/16 361/111 |
| 10,193,324 | B2 * | 1/2019 | Waldron | H03K 17/567 |
| 10,411,694 | B2 * | 9/2019 | Cairoli | H02H 7/005 |
| 10,554,201 | B2 * | 2/2020 | Cairoli | H03K 17/567 |
| 2010/0277006 | A1 | 11/2010 | Urciuoli | |
| 2014/0185346 | A1 | 7/2014 | Liu et al. | |
| 2018/0026570 | A1 | 1/2018 | Cairoli et al. | |
| 2018/0026623 | A1 | 1/2018 | Cairoli et al. | |

* cited by examiner

*Primary Examiner* — Kenneth B Wells
(74) *Attorney, Agent, or Firm* — J. Bruce Schelkopf; Taft Stettinius & Hollister LLP

(57) ABSTRACT

Systems, methods, techniques and apparatuses of power switch control are disclosed. One exemplary embodiment is a power switch comprising a thyristor-based branch including a thyristor device; a FET-based branch coupled in parallel with the thyristor-based branch and including a FET device; and a controller. The controller is structured to turn on the FET device, turn on the thyristor device after turning on the FET device based on a thyristor voltage threshold, and update the thyristor voltage threshold based on a voltage measurement corresponding to the thyristor-based branch measured while the thyristor device is turned on.

20 Claims, 5 Drawing Sheets

POWER SWITCH CONTROL

BACKGROUND

The present disclosure relates generally to power switch control. One type of power switch is a ThyFET switch which includes a thyristor-based branch coupled in parallel with a field effect transistor (FET) based branch. Depending on the magnitude of current flowing through the ThyFET switch, the ThyFET switch may be controlled so that current flows primarily through the thyristor-based branch or the FET-based branch. For example, above a current threshold, a power switch may minimize power loss by turning on the thyristor-based branch. Existing power switches suffer from a number of shortcomings and disadvantages. There remain unmet needs including reducing power losses and reducing thermal stress. For instance, factors such as changes in temperature or device degradation affect the power loss profile of a ThyFET switch, causing a ThyFET that assumes a fixed turn-on threshold level for a thyristor device to operate with sub-optimal power losses as current flows through the FET-based branch instead of the thyristor-based branch. In view of these and other shortcomings in the art, there is a significant need for the unique apparatuses, methods, systems and techniques disclosed herein.

DISCLOSURE OF ILLUSTRATIVE EMBODIMENTS

For the purposes of clearly, concisely and exactly describing non-limiting exemplary embodiments of the disclosure, the manner and process of making and using the same, and to enable the practice, making and use of the same, reference will now be made to certain exemplary embodiments, including those illustrated in the figures, and specific language will be used to describe the same. It shall nevertheless be understood that no limitation of the scope of the present disclosure is thereby created, and that the present disclosure includes and protects such alterations, modifications, and further applications of the exemplary embodiments as would occur to one skilled in the art with the benefit of the present disclosure.

SUMMARY OF THE DISCLOSURE

Exemplary embodiments of the disclosure include unique systems, methods, techniques and apparatuses for power switch control. Further embodiments, forms, objects, features, advantages, aspects and benefits of the disclosure shall become apparent from the following description and drawings.

DETAILED DESCRIPTION OF ILLUSTRATIVE EMBODIMENTS

Figure 1:
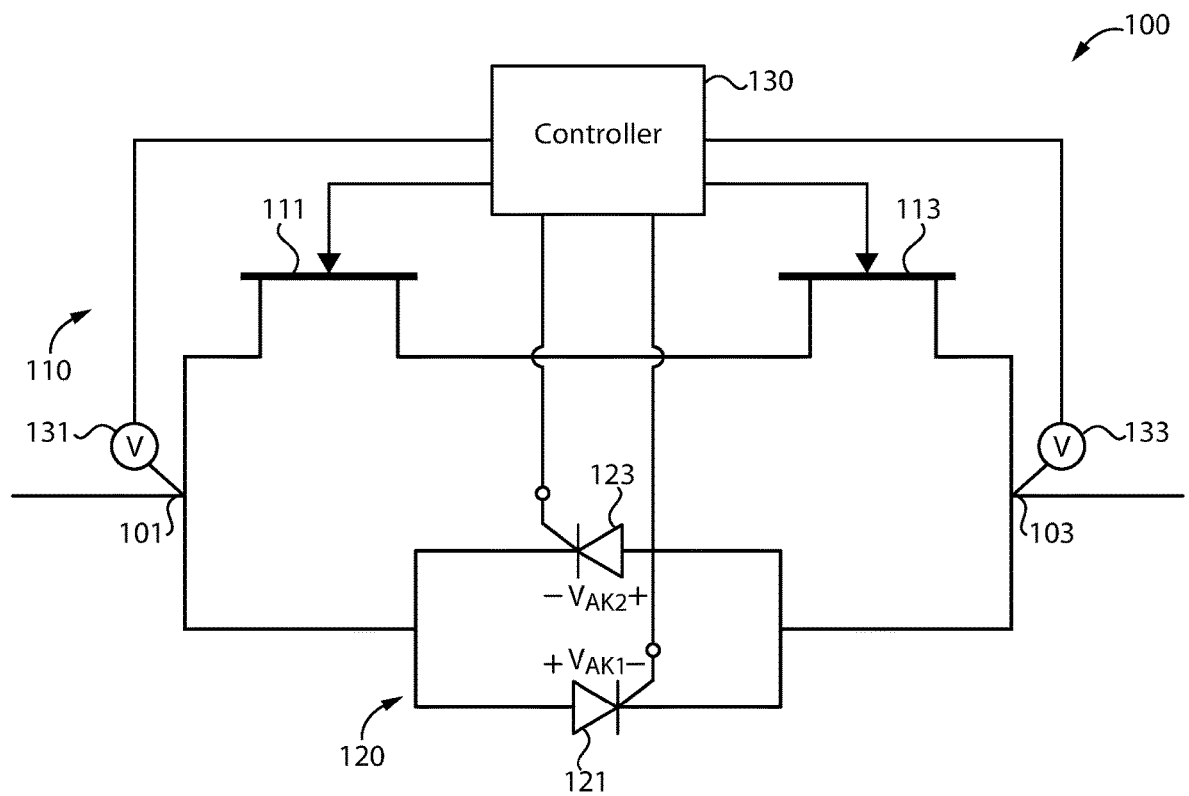
FIG. 1 illustrates an exemplary power switch.

With reference to FIG. 1, there is a circuit diagram illustrating an exemplary power switch 100, also known as a ThyFET switch. It shall be appreciated that power switch 100 may be implemented in a variety of applications, including solid state contactors, solid state circuit breakers, solid state disconnectors, and other types of devices structured to open in order to interrupt the flow of current, to name but a few examples. Power switch 100 may be incorporated into alternating current (AC) power systems, direct current (DC) power systems, power distribution systems, power transmission systems, facility power systems, vehicular power systems, and machine drives, to name but a few examples.

Power switch 100 includes a field-effect transistor (FET) based branch 110 and a thyristor-based branch 120 coupled in parallel between terminals 101 and 103. Branch 110 and branch 120 are both structured to selectively allow current to flow between terminals 101 and 103. In other embodiments, power switch 100 may be structured to conduct current in a single direction.

FET-based branch 110 includes a FET device 111 and a FET device 113 coupled in series. FET devices 111 and 113 may each include a junction gate field-effect transistor (JFET) or a metal-oxide-semiconductor field-effect transistors (MOSFETs) based on various semiconductor technologies such as silicon (Si), silicon-carbide (SiC), or gallium-nitride (GaN), to name but a few examples.

Each FET device is a power semiconductor device with a different conduction power loss profile relative to thyristor devices. The voltage-current characteristic of FET devices is mostly resistive and yields lower conduction losses at lower current magnitudes, in comparison to thyristor devices. Thyristor devices have voltage-current characteristics related to a fixed voltage of the p-n junction voltage of a FET device. The fixed voltage characteristic generates relatively high losses compared to FET devices at lower current magnitudes, but generates relatively lower losses as compared to FET devices at higher current magnitudes.

As the magnitude of current flowing through branch 110 increases, the voltage across branch 110 increases. Furthermore, as the magnitude of the current flowing through branch 110 increases, power losses increase at a rate greater than a linear increase, also known as an exponential increase.

In certain embodiments, branch 110 includes additional components such as additional FET devices or filters, to name but a few examples. In other embodiments, branch 110 includes a single FET device.

Thyristor-based branch 120 includes a thyristor device 121 and a thyristor device 123 coupled in an antiparallel configuration. Thyristor devices 121 and 123 may each include a silicon controlled rectifier (SCR), a silicon controlled switch (SCS), a gate turn-off thyristor (GTO), or an integrated gate-commutated thyristor (IGCT), to name but a few examples.

Thyristor device 121 is structured such that when turned on, current may flow from terminal 101 to terminal 103 by way of thyristor device 121. Thyristor device 123 is structured such that when turned on, current may flow from terminal 103 to terminal 101 by way of thyristor device 123. Depending on the direction of current from terminal 101 to terminal 103 or vice-versa, there is a positive voltage $V_{AK1}$ from the anode to cathode of device 121 or a positive voltage $V_{AK2}$ from the anode to cathode of device 123. When either voltage $V_{AK1}$ or $V_{AK2}$ is positive, the voltage is referred to as a forward voltage.

Thyristor device 121 and thyristor device 123 are structured such that the voltage across each thyristor device remains constant while conducting current over a range of magnitudes. As a result, power loss through thyristor-based branch 120 may correspond proportionally to the magnitude of the current flowing through branch 120.

The FET devices and the thyristor devices are each selected and constructed or sized to minimize power losses of power switch 100 at both lower current magnitudes and higher current magnitudes, thus providing an improved loss profile. Each FET device includes a first power loss characteristic based on a rated current. Each thyristor device includes a second power loss characteristic based on a surge current, for example and without limitation, an inrush current and a start current associated with an electric motor.

Power switch 100 includes a controller 130 structured to measure electrical characteristics of power switch 100. In the illustrated embodiment, controller 130 includes a voltage sensor 131 coupled to terminal 101 and a voltage sensor 133 coupled to terminal 103. Each voltage sensor is structured to measure a voltage of power switch 100. For example, each voltage sensor may measure a line-to-ground voltage. Controller 130 may then use the measured voltages to determine a voltage across power switch 100. In another embodiment, controller 130 may include a single voltage sensor to measure a voltage across power switch 100.

Controller 130 controls the devices of branches 110 and 120 such that only branch 110 is turned on when controller 130 determines the magnitude of current conducted by power switch 100 is less than a current threshold, and both branches 110 and 120 are turned on when controller 130 determines the magnitude of the current conducted by power switch 100 is greater than the current threshold. Controller 130 uses the voltage measurements from voltage sensors 131 and 133 to determine a voltage threshold corresponding to the current threshold. Using the voltage threshold, controller 130 determines whether the magnitude of the conducted current is less than or greater than the current threshold. As explained in more detail below, controller 130 is structured to update the voltage threshold based on operating conditions of power switch 100. It shall be appreciated that the features of power switch 100 may be present in other exemplary power switches described herein, such as power switches 500 and 600.

Figure 2:
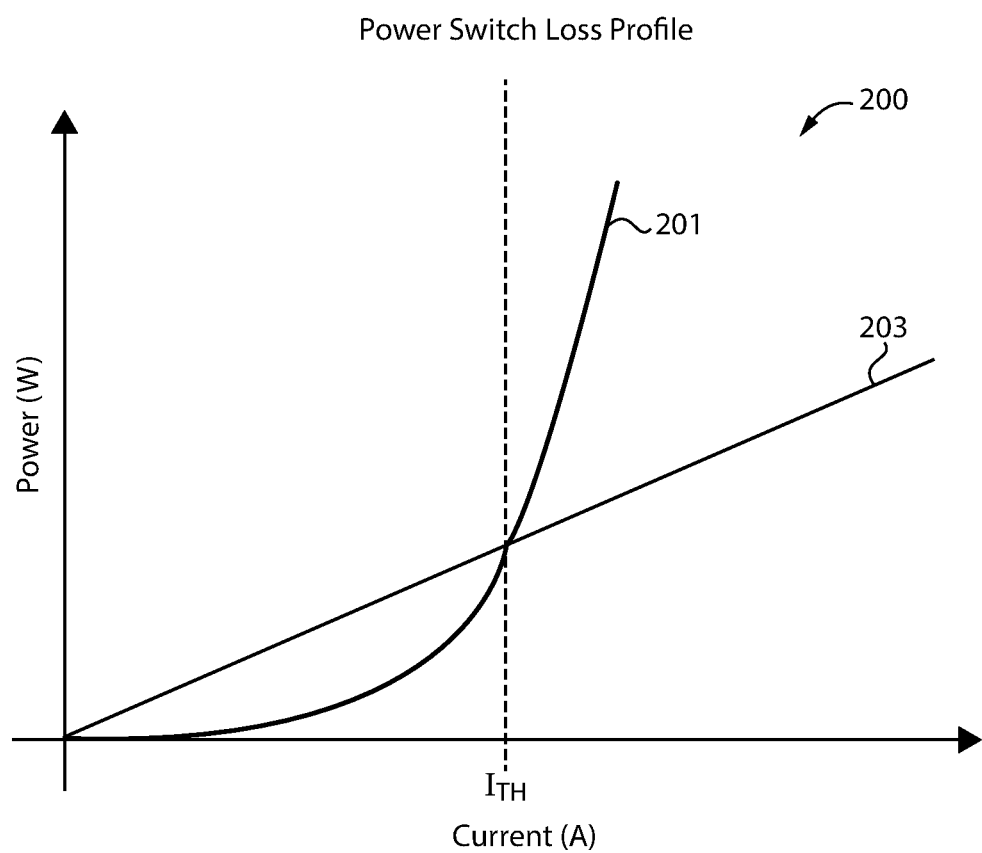
FIG. 2 is a graph illustrating electrical characteristics of an exemplary power switch.

With reference to FIG. 2, there is a graph 200 illustrating power losses of an exemplary power switch, such as power switch 100, including a single FET device coupled in parallel with a single thyristor device. Graph 200 includes a line 201 representing power losses generated by a FET device over a range of current magnitudes, and a line 203 representing power losses generated by a thyristor device over a range of current magnitudes.

As illustrated by graph 200, there is a current magnitude, also known as current threshold $I_{TH}$, where the power loss generated by the current magnitude flowing through the FET device is equal to the power loss generated by the current magnitude flowing through the thyristor device. For all current magnitudes less than current threshold $I_{TH}$, the FET device generates less power loss compared to the thyristor device. For all current magnitudes greater than current threshold $I_{TH}$, the thyristor device generates less power loss compared to the FET device.

By controlling the power switch to turn on the thyristor device for all current magnitudes greater than current threshold $I_{TH}$, the exemplary power switch reduces power losses. By allowing current to flow through both the FET device configuration and the thyristor device configuration after the current magnitude exceeds current threshold $I_{TH}$, the combined loss profile of the power switch is less than the separate power loss profiles of the FET device or the thyristor device.

As illustrated by graph 200, the favorable combined loss profile is dependent on current sharing between the FET device and the thyristor device. Therefore, the more accurately the voltage threshold used by the controller corresponds to the current threshold, the smaller the power losses of the power switch. If the voltage threshold corresponds to a current magnitude greater than current threshold $I_{TH}$, the high voltage across the thyristor device will increase power losses and more current will flow through the FET device, also increasing power losses. A voltage threshold less than the forward voltage required by the thyristor device to turn on would result in the thyristor device not being turned on.

Operating conditions of an exemplary power switch will cause the current threshold $I_{TH}$ to change. For example, the resistance of the FET device increases as the operating temperature of the FET device increases. As the resistance of the FET device increases, current threshold $I_{TH}$ decreases. Resistance of the FET device may also increase due to device degradation over time. Furthermore, as the thyristor device junction temperature increases, the gate voltage threshold of the thyristor device decreases. The exemplary power switch reduces power losses by regularly adjusting the voltage threshold used to determine whether the thyristor device should be turned on.

Figure 3:
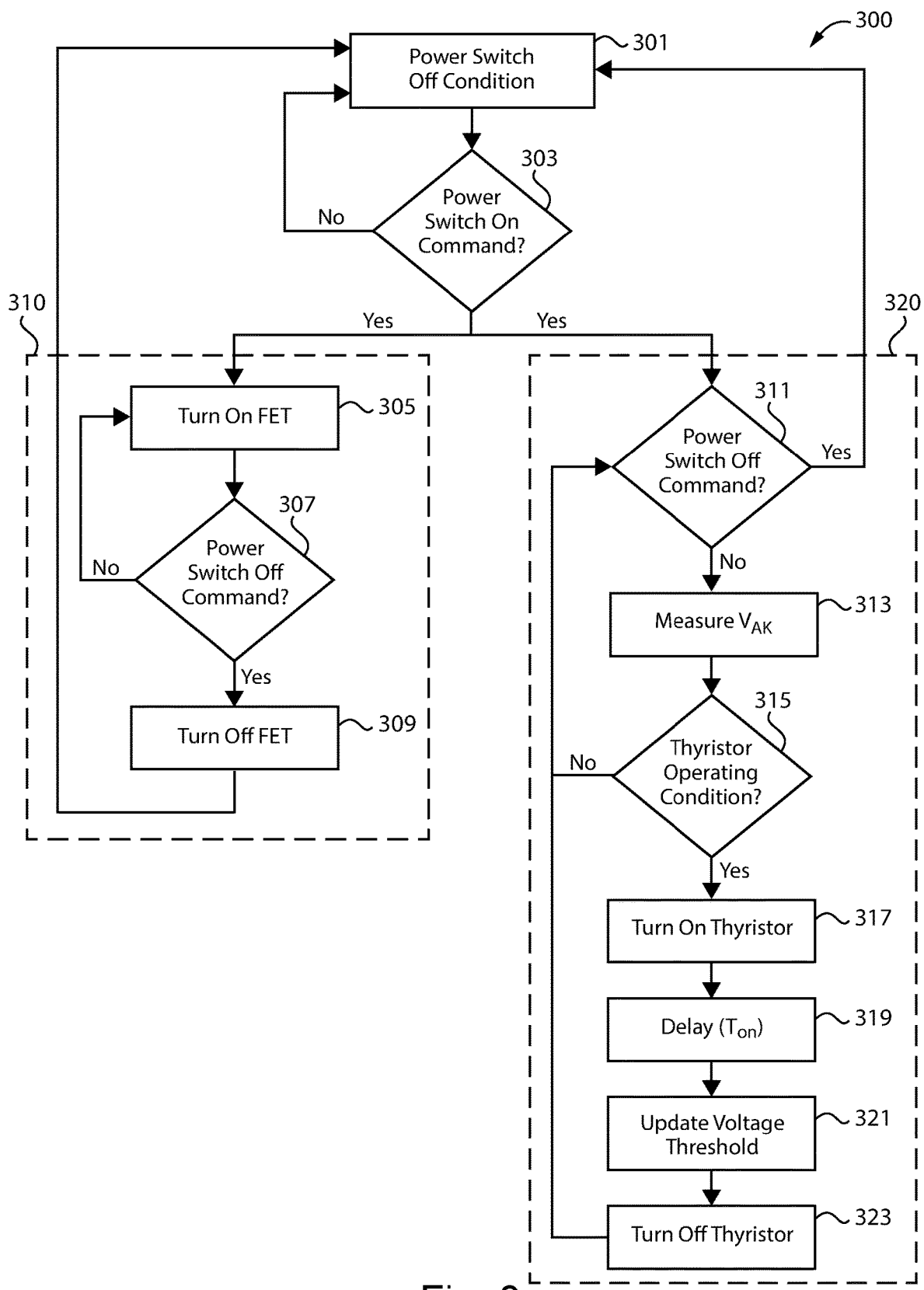
FIG. 3 is a flowchart illustrating an exemplary process for operating an exemplary power switch.

With reference to FIG. 3, there is a flowchart illustrating an exemplary process 300 for operating an exemplary power switch, such as power switch 100. It shall be appreciated that a number of variations and modifications to process 300 are contemplated including, for example, the omission of one or more aspects of process 300, the addition of further conditionals and operations, and/or the reorganization or separation of operations and conditionals into separate processes.

Process 300 begins at operation 301 where a controller operates the power switch in a power switch off condition such that the FET-based branch and the thyristor-based branch are turned off. It shall be appreciated that the FET-based branch is turned off by the controller when at least one FET device of the FET-based branch is turned off so as to substantially eliminate the flow of current through the FET-based branch. Similarly, the FET-based branch is turned on by the controller when at least one FET device of the FET-based branch is turned on so as to allow the flow of current through the FET-based branch. It shall be appreciated that the thyristor-based branch is turned off by the controller when at least one thyristor device of the thyristor-based branch is turned off effective to substantially eliminate the flow of current through the thyristor-based branch. Similarly, the thyristor-based branch is turned on by the controller when at least one thyristor device of the thyristor-based branch is turned on effective to allow the flow of current through the thyristor-based branch. The controller may operate the power switch in the power switch off condition by turning off at least one switch of the FET-based branch and the thyristor-based branch, or by controlling at least one switch of the FET-based branch and the thyristor-based branch to remain in an off condition.

Process 300 proceeds to conditional 303 where the controller determines whether an instruction to turn on the power switch has been received. Instructions may be received by an external control system, such as an intelligent electronic device (IED), or may be generated by the controller. If the instruction was not received, process 300 enters a loop whereby process 300 returns to operation 301 where the power switch remains in the power switch off condition while regularly performing conditional 303 until the turn-on instruction is received. Once the turn-on instruction is received, process 300 proceeds to a FET control subprocess 310 and thyristor control subprocess 320 such that subprocess 310 and subprocess 320 are executed simultaneously until the controller receives an instruction to turn off the power switch.

During subprocess 310, process 300 proceeds first to operation 305 where the controller turns on the FET-based branch. Process 300 proceeds to conditional 307 where the controller determines whether an instruction to turn off the power switch has been received. If the instruction was not received, process 300 enters a loop whereby process 300 returns to operation 305 where the FET-based branch remains turned on in the power switch on condition while regularly performing conditional 303 until the turn-off instruction is received. Once the turn-off instruction is received, process 300 proceeds to operation 309 where the controller turns off the FET-based branch. Process 300 then exits subprocess 310 and returns to operation 301.

During subprocess 320, process 300 proceeds first to conditional 311 where the controller determines whether an instruction to turn off the power switch has been received. If the turn-off instruction was received, process 300 exits subprocess 320 and returns to operation 301. If the turn-off instruction has not been received, process 300 proceeds to operation 313.

During operation 313, the controller determines a thyristor forward voltage $V_{AK}$ while the FET-based branch is turned on and the thyristor-based branch is turned off. For example, the controller may determine voltage $V_{AK}$ by measuring across an anode and a cathode of a thyristor device of the thyristor-based branch using a voltage sensor. In another example, the controller may determine voltage $V_{AK}$ by measuring a first line-to-ground voltage at the anode of a thyristor device, measuring a second line-to-ground voltage at the cathode of the thyristor, and determining voltage $V_{AK}$ using the first and second line-to-ground voltage measurements.

The controller stores the most recently determined voltage $V_{AK}$, as well as previously determined voltages $V_{AK}$. For example, the voltage $V_{AK}$ may be stored in a vector such that $V_{AK}[n]$ is the most recently determined $V_{AK}$, $V_{AK}[n-1]$ is the second most recently determined $V_{AK}$, and so on. Each time a new voltage $V_{AK}$ is determined, n is incremented such that the previous $V_{AK}[n]$ becomes $V_{AK}[n-1]$.

Process 300 proceeds to conditional 315 where the controller determines whether a thyristor device turn-on condition is occurring. If the controller determines a thyristor device turn-on condition is not occurring, process 300 returns to conditional 311. If the controller determines a thyristor device turn-on condition is occurring, process 300 proceeds to operation 317.

The controller may determine a thyristor device is ready to be turned on, i.e. a turn-on condition is occurring, if the voltage $V_{AK}[n]$ is greater than a thyristor voltage threshold, the thyristor device is turned off, and the magnitude of the current flowing through the power switch is increasing. For the initial execution of conditional 315, the thyristor voltage threshold may be a value stored in memory of the controller based on a device data sheet, to name but one example. The controller will not attempt to turn on the thyristor device if the forward voltage is less than the thyristor voltage threshold. As explained in more detail below, the thyristor voltage threshold is updated each time the controller determines a thyristor device turn-on condition is occurring.

The controller may determine the current conducted through the power switch is increasing by determining $V_{AK}[n]$ is greater than $V_{AK}[n-1]$. The controller will not turn on the thyristor device unless the current is increasing to ensure the thyristor device is turned on before a peak current flows through the power switch.

During operation 317, the controller turns on the thyristor device of the thyristor-based branch. In order to turn on the thyristor device, the controller transmits a pulse to the gate of the thyristor device while the forward voltage of the thyristor device is greater than the instant forward voltage threshold of the thyristor device. The gate pulse includes a current magnitude greater than a gate current threshold value for the thyristor device. The width of the gate pulse is a time period $T_{on}$ of sufficient length to turn on the thyristor device.

Process 300 proceeds to operation 319 where the controller waits to update the thyristor threshold voltage until after the controller has finished transmitting the gate pulse to the thyristor device. After a delay of at least time period $T_{on}$, the controller proceeds to operation 321.

During operation 321, the controller updates the thyristor threshold voltage based on a voltage across the thyristor device measured immediately after the gate pulse terminates. Once the thyristor device is triggered successfully, the voltage drop across the combination of FET and thyristor devices is very nearly equal to the thyristor threshold voltage since the current through the thyristor device is small, just after the trigger instant. The thyristor threshold voltage may be determined using the following equation, where $V_{TH}$ is the thyristor voltage threshold, $V_{AK}$ is the forward voltage across the thyristor device, n is the measurement index of the forward voltage $V_{AK}$ used in conditional 315, $T_{on}$ is the time width of the gate pulse, $T_s$ is the sampling rate of the measurements taken to determine $V_{AK}$, and $V_{margin}$ is a noise margin voltage.

$$V_{TH}=V_{AK}[n+(T_{on}/T_s)]+V_{margin} \quad (1)$$

$V_{margin}$ is added to the forward voltage measurement immediately after the gate pulse terminates to determine an updated thyristor threshold voltage. $V_{margin}$ is a noise margin configured to reduce erroneous thyristor device triggers. $V_{margin}$ may be a voltage in a range between 1 and 100 mV, to name but one example.

Process 300 proceeds from operation 321 to operation 323 where the thyristor device is turned off. It shall be appreciated that the thyristor device is turned off at the next current zero-crossing after the controller removes the gate pulse to the thyristor device. Therefore, the controller may be said to turn off the thyristor device by withholding a gate pulse of a conducting thyristor device at the time of a current zero-crossing. Process 300 then returns to conditional 311. Process 300 continues to execute subprocess 320 until the controller receives a turn-off instruction.

Figure 4:
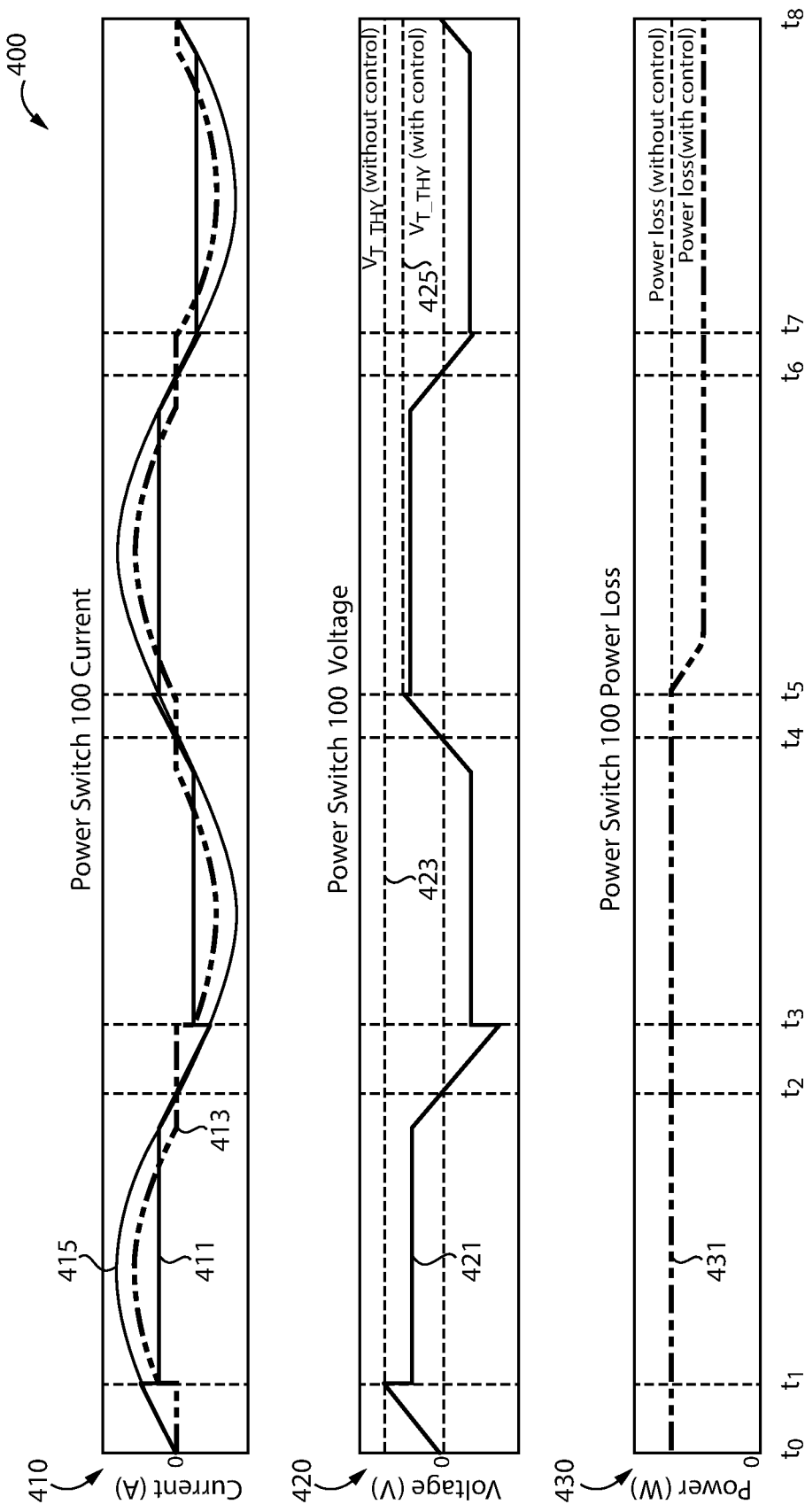
FIG. 4 is a set of graphs illustrating electrical characteristics of a power switch operated using the exemplary process of FIG. 3.

With reference to FIG. 4, there is illustrated a plurality of graphs 400 illustrating electrical characteristics of exemplary power switch 100 controlled using exemplary process 300 for a time period between $t_0$ and $t_8$. The plurality of graphs 400 includes a graph 410 illustrating current flowing through power switch 100, a graph 420 illustrating voltage across power switch 100, and a graph 430 illustrating power switch 100 power loss. During the time period between to and $t_4$, the controller operates the power switch using an initial thyristor threshold voltage. During the time period between $t_4$ and $t_8$, the controller operates power switch 100 using an updated thyristor threshold voltage.

Current graph 410 includes a current line 411 illustrating the magnitude of current flowing through FET-based branch 110; a current line 413 illustrating the magnitude of current flowing through thyristor-based branch 120; and combined current line 415 illustrating the total current flowing through power switch 100.

Voltage graph 420 includes a voltage line 421 illustrating a magnitude of voltage across power switch 100; an initial voltage threshold line 423 illustrating the initial thyristor voltage threshold used determine whether the thyristor device should be turned on between time periods $t_0$-$t_4$; and an updated voltage threshold line 425 illustrating the updated thyristor voltage threshold used to determine whether the thyristor device should be turned on between time periods $t_4$-$t_8$. At times $t_1$ and $t_3$, a thyristor device is turned on using the initial thyristor voltage threshold. At times $t_5$ and $t_7$, a thyristor device is turned on using the updated thyristor voltage threshold. As illustrated in graph 420, the updated voltage threshold is lower than the initial voltage threshold and closer to the forward voltage necessary to turn on the thyristor device, causing the power switch to turn on the thyristor device when the magnitude of the current through the FET-based branch is less than when the thyristor device is turned on using the initial thyristor voltage threshold.

Power graph 430 includes a power loss line 431 illustrating the power losses caused by current flowing through power switch 100. It is important to note that at $t_5$, when the thyristor device is turned on using the updated thyristor threshold voltage, the power loss of power switch 100 reduces relative to the power loss during the time period between $t_0$-$t_4$ when the controller was not using the updated thyristor threshold voltage.

Figure 5:
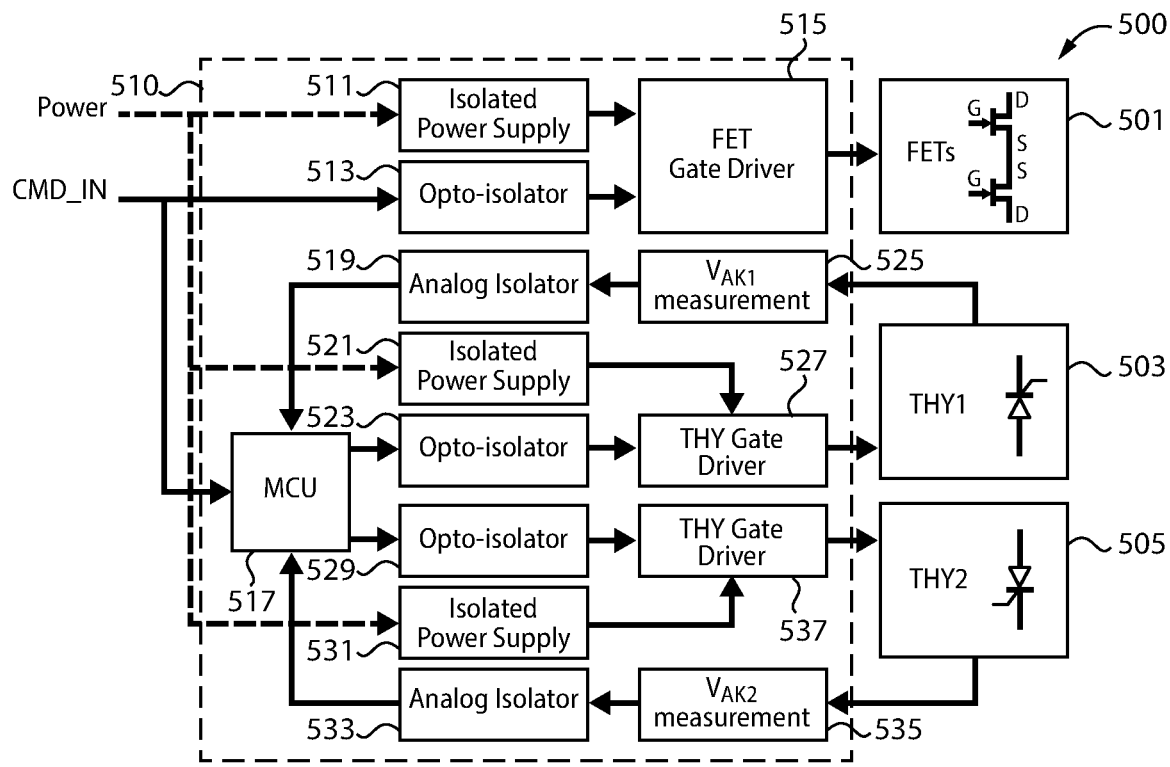
FIGS. 5-6 are block diagrams illustrating exemplary controllers of a power switch.

With reference to FIG. 5, there is illustrated an exemplary power switch 500 including a controller 510, a FET-based branch 501, and a thyristor-based branch including a thyristor device 503 and thyristor device 505. Controller 510 is structured to receive power from a power source, receive a command signal from a control device, receive measurements of electrical characteristics of power switch 500, and output control signals to controllable devices of power switch 500 using the received power, the received command signal, and the received measurements.

Controller 510 includes isolated power supplies 511, 521, and 531 being coupled between a power source and a gate drive of controller 510. The power source may be structured to output alternating current (AC) power or direct current (DC) power. The power source may be a utility grid, a facility grid, or a generator, to name but a few examples. Each isolated power supply is structured to receive power from the power source and output a power signal isolated from the received power to one of the gate drivers of controller 510. The power signal may be isolated using a transformer, to name but one example.

Controller 510 includes opto-isolators 513, 523, and 529, also known as optical couplers or optocouplers. Each opto-isolator is structured to receive a signal and output an isolated signal based on the received signal, the isolated signal being isolated using light. Opto-isolator 513 receives a command signal from a device external to the controller. Opto-isolators 523 and 519 receive an output signal from a processing device 517.

Controller 510 includes analog isolators 519 and 533, each structured to receive a measurement signal from a measuring device of controller 510 and output an isolated signal based on the received measurement signal. The isolated signal may be isolated from the measurement signal using a transformer or an opto-isolator, to name but a few examples. Since the frequency of the measurement signal is the same as the grid frequency, the bandwidth requirement for the analog isolators is low.

Controller 510 includes measuring devices 525 and 535, each measuring device being structured to measure an electrical characteristic of a thyristor device of power switch 500. In the illustrated embodiment, measuring device 525 is structured to measure a voltage from an anode of thyristor device 503 to a ground of gate driver 527, and output a measurement signal based on the measured voltage. In the illustrated embodiment, measuring device 535 is structured to measure a voltage from an anode of the thyristor device 505 to a ground of gate driver 537, and output a measurement signal based on the measured voltage. Before outputting each measurement signal, measuring devices 525 and 535 remove any portions of measurement signal corresponding to a negative voltage across the corresponding thyristor device.

Controller 510 includes a plurality of gate drivers including FET gate driver 515, thyristor device gate driver 527, and thyristor device gate driver 537. Each gate driver receives a power signal from an isolated power supply and a command signal. Gate driver 515 uses the power signal and the command signal to output a control signal to the switches of FET-based branch 501 effective to turn on or turn off the switches of FET-based branch 501 based on the received command signal. Gate driver 527 uses the power signal and the command signal received from processing device 517 to output a control signal to thyristor device 503 effective to operate thyristor device 503. Gate driver 537 uses the received power signal and the command signal received from processing device 517 to output a control signal to thyristor device 505 effective to operate thyristor device 505.

Processing device 517 is structured to receive the measurement signal from measuring device 525 by way of analog isolator 519, receive the measurement signal from measuring device 535 by way of analog isolator 533, and receive the command signal. Using the received signals, processing device 517 is structured to generate and output a control signal to thyristor device gate driver 527 and thyristor device gate driver 537. Processing device 517 generates the control signal based on an exemplary control process, such as process 300 in FIG. 3.

Figure 6:
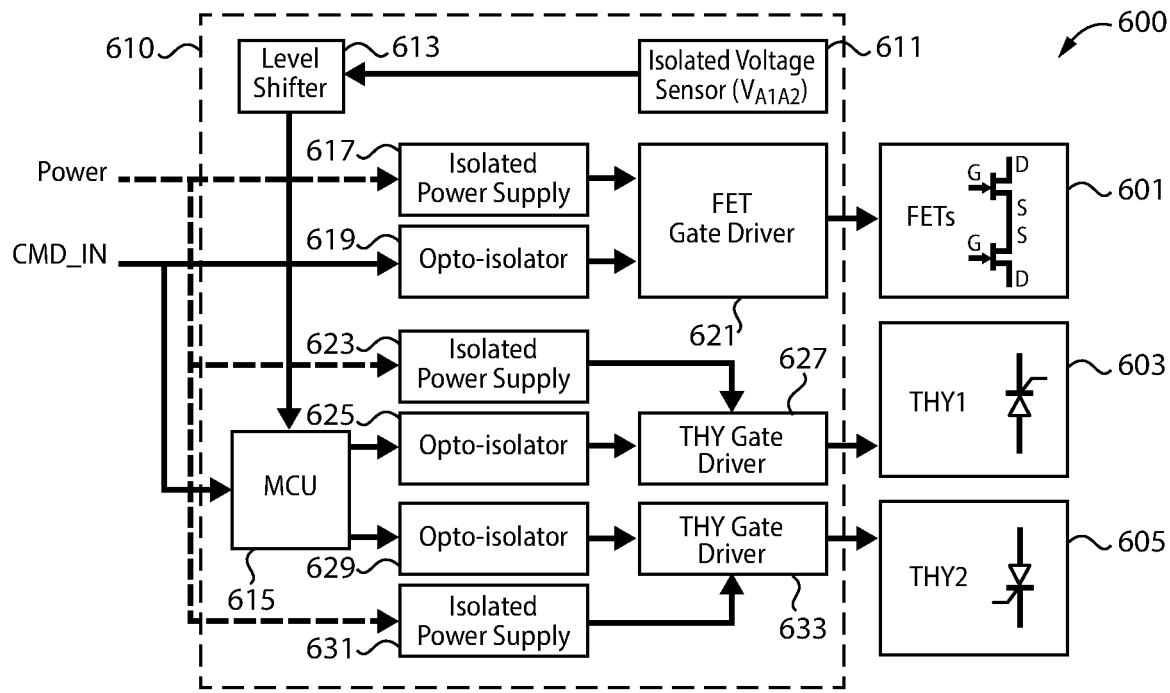

With reference to FIG. 6, there is illustrated an exemplary power switch 600 including a controller 610, a FET-based branch 601, and a thyristor-based branch including a thyristor device 603 and thyristor device 605. Controller 610 is structured to receive power from a power source, receive a command signal from a control device, receive measurements of electrical characteristics of power switch 600, and output control signals to controllable devices of power switch 600 using the received power, the received command signal, and the received measurements.

Controller 610 includes isolated power supplies 617, 623, and 631 being coupled between a power source and a gate drive of controller 610. The power source may be structured to output AC power or DC power. The power source may be a utility grid, a facility grid, or a generator, to name but a few examples. Each isolated power supply is structured to receive power from the power source and output a power signal isolated from the received power to one of the gate drivers of controller 610. The power signal may be isolated using a transformer, to name but one example.

Controller 610 includes opto-isolators 619, 625, and 629, also known as optical couplers or optocouplers. Each opto-isolator is structured to receive a signal and output an isolated signal based on the received signal, the isolated signal being isolated using light. Opto-isolator 619 receives a command signal from a device external to the controller. Opto-isolators 625 and 619 receive an output signal from a processing device 615.

Controller 610 includes measuring device 611 structured to measure an electrical characteristic of the thyristor-based branch of power switch 600. In the illustrated embodiment, measuring device 611 is structured to measure a voltage across both thyristor devices 603, 605 and output a measurement signal based on the measured voltage to a level shifter 613. The portions of the measurement signal corresponding to a negative voltage are level shifted.

Controller 610 includes a plurality of gate drivers including FET gate driver 621, thyristor device gate driver 627, and thyristor device gate driver 633. Each gate driver receives a power signal from an isolated power supply and a command signal. Gate driver 621 uses the power signal and the command signal to output a control signal to the switches of FET-based branch 601 effective to turn on or turn off the switches of FET-based branch 601 based on the received command signal. Gate driver 627 uses the power signal and the command signal received from processing device 615 to output a control signal to thyristor device 603 effective to operate thyristor device 603. Gate driver 633 uses the received power signal and the command signal received from processing device 615 to output a control signal to thyristor device 605 effective to operate thyristor device 605.

Processing device 615 may include a microcontroller or a microprocessor, to name but a few examples. Processing device 615 is structured to receive the level-shifted measurement signal from level shifter 613 and receive the command signal. The portion of the level shifted measurement signal corresponding to negative voltage across the thyristor devices is received by an analog to digital converter (ADC) of processing device 615 and subtracted from a reference voltage level of the ADC, effectively rectifying the measurement signal. Using the received signals, processing device 615 is structured to generate and output a control signal to thyristor device gate driver 627 and thyristor device gate driver 633. Processing device 615 generates the control signal based on an exemplary control process, such as process 300 in FIG. 3.

Further written description of a number of exemplary embodiments shall now be provided. One embodiment is an apparatus comprising: a thyristor-based branch including a thyristor device; a FET-based branch coupled in parallel with the thyristor-based branch and including a FET device; and a controller structured to turn on the FET device, turn on the thyristor device after turning on the FET device based on a thyristor voltage threshold, and update the thyristor voltage threshold based on a voltage measurement corresponding to the thyristor-based branch measured while the thyristor device is turned on.

In certain forms of the foregoing apparatus, the controller is structured to turn on the thyristor device in response to determining a second voltage measurement is greater than the thyristor voltage threshold. In certain forms, the controller is structured to turn on the thyristor device also in response to determining the thyristor device is turned off and determining a current flowing through the FET-based branch is increasing. In certain forms, the controller includes a voltage sensor structured to transmit a series of voltage measurements at a sampling rate, the series of voltage measurements including the first voltage measurement and the second voltage measurement. In certain forms, the controller is structured to turn on the thyristor device by transmitting a gate pulse to the thyristor device, and wherein the updated thyristor threshold voltage is equal to a sum of a voltage margin and the voltage measurement of the series of voltage measurements taken after the gate pulse terminates. In certain forms, the controller is structured to turn on the thyristor device by transmitting a gate pulse to the thyristor device, and wherein the controller updates the thyristor threshold voltage using the following equation, where $V_{TH}$ is the updated thyristor voltage threshold, $V_{AK}$ is the series of voltage measurements, n is an index number of the second voltage measurement, $T_{on}$ is a width of the gate pulse, $T_s$ is the sampling rate of the series of measurements, and $V_{margin}$ is a noise margin voltage:

$$V_{TH} = V_{AK}[n+(T_{on}/T_s)] + V_{margin} \qquad (2)$$

In certain forms, the controller is structured to turn off the thyristor device, and then turn on the thyristor device using the updated thyristor threshold voltage.

Another exemplary embodiment is a method comprising: operating a thyristor-based branch including a thyristor device and a FET-based branch coupled in parallel with the thyristor-based branch and including a FET device; turning on the FET device; turning on the thyristor device after turning on the FET device based on a thyristor voltage threshold; receiving a voltage measurement measured while the thyristor device is turned on; and updating the thyristor voltage threshold based on the voltage measurement. In certain forms of the foregoing method, turning on the thyristor device in response to determining a second voltage measurement is greater than the thyristor voltage threshold. In certain forms, turning on the thyristor device is also in response to determining the thyristor device is turned off and determining a current flowing through the FET-based branch is increasing. In certain forms, the method comprises operating a controller including a voltage sensor structured to transmit a series of voltage measurements at a sampling rate, the series of voltage measurements including the first voltage measurement and the second voltage measurement. In certain forms, turning on the thyristor device includes transmitting a gate pulse to the thyristor device, and wherein the updated thyristor threshold voltage is equal to a sum of a noise margin voltage and the voltage measurement of the series of voltage measurements taken after the gate pulse terminates. In certain forms, turning on the thyristor device includes transmitting a gate pulse to the thyristor device, and wherein updating the thyristor threshold voltage includes using the following equation, where $V_{TH}$ is the updated thyristor voltage threshold, $V_{AK}$ is the series of voltage measurements, n is an index number of the second voltage measurement, $T_{on}$ is a width of the gate pulse, $T_s$ is the sampling rate of the series of measurements, and $V_{margin}$ is a noise margin voltage:

$$V_{TH} = V_{AK}[n+(T_{on}/T_s)] + V_{margin} \qquad (3)$$

In certain forms, the method comprises turning off the thyristor device; and turning on the thyristor device using the updated thyristor threshold voltage.

A further exemplary embodiment is a controller for a power switch including a FET device and a thyristor device, the controller comprising: a voltage sensor structured to output a series of voltage measurements corresponding to a voltage of the thyristor device including a first voltage measurement; and a processing device structured to execute a set of instructions effective to turn on the FET device, turn on the thyristor device after turning on the FET device based on a thyristor voltage threshold, update the thyristor voltage threshold based on the first voltage measurement measured while the thyristor device is turned on, turn off the thyristor device, and turn on the thyristor device using the updated thyristor threshold voltage.

In certain forms of the foregoing controller, the controller is structured to turn on the thyristor device in response to determining a second voltage measurement of the series of voltage measurements is greater than the thyristor voltage threshold. In certain forms, the controller is structured to turn on the thyristor device also in response to determining the thyristor device is turned off and determining a current flowing through the FET device is increasing. In certain forms, the controller is structured to turn on the thyristor device by transmitting a gate pulse to the thyristor device. In certain forms, the updated thyristor threshold voltage is equal to a sum of a voltage margin and the voltage measurement of the series of voltage measurements taken after the gate pulse terminates. In certain forms, the controller updates the thyristor threshold voltage using the following equation, where $V_{TH}$ is the updated thyristor voltage threshold, $V_{AK}$ is the series of voltage measurements, n is an index number of the second voltage measurement, $T_{on}$ is a width of the gate pulse, $T_s$ is the sampling rate of the series of measurements, and $V_{margin}$ is a noise margin voltage:

$$V_{TH}=V_{AK}[n+(T_{on}/T_s)]+V_{margin} \quad (4)$$

It is contemplated that the various aspects, features, processes, and operations from the various embodiments may be used in any of the other embodiments unless expressly stated to the contrary. Certain operations illustrated may be implemented by a computer including a processing device executing a computer program product stored on a non-transient, computer-readable storage medium, where the computer program product includes instructions causing the processing device to execute one or more of the operations, or to issue commands to other devices to execute one or more operations.

While the present disclosure has been illustrated and described in detail in the drawings and foregoing description, the same is to be considered as illustrative and not restrictive in character, it being understood that only certain exemplary embodiments have been shown and described, and that all changes and modifications that come within the spirit of the present disclosure are desired to be protected. It should be understood that while the use of words such as "preferable," "preferably," "preferred" or "more preferred" utilized in the description above indicate that the feature so described may be more desirable, it nonetheless may not be necessary, and embodiments lacking the same may be contemplated as within the scope of the present disclosure, the scope being defined by the claims that follow. In reading the claims, it is intended that when words such as "a," "an," "at least one," or "at least one portion" are used there is no intention to limit the claim to only one item unless specifically stated to the contrary in the claim. The term "of" may connote an association with, or a connection to, another item, as well as a belonging to, or a connection with, the other item as informed by the context in which it is used. The terms "coupled to," "coupled with" and the like include indirect connection and coupling, and further include but do not require a direct coupling or connection unless expressly indicated to the contrary. When the language "at least a portion" and/or "a portion" is used, the item can include a portion and/or the entire item unless specifically stated to the contrary. The term "based on" includes using an identified value to perform a function.

What is claimed is:

1. An apparatus comprising:
   a thyristor-based branch including a thyristor device;
   a FET-based branch coupled in parallel with the thyristor-based branch and including a FET device; and
   a controller structured to turn on the FET device, turn on the thyristor device after turning on the FET device based on a thyristor voltage threshold, and update the thyristor voltage threshold based on a voltage measurement corresponding to the thyristor-based branch measured while the thyristor device is turned on.

2. The apparatus of claim 1, wherein the controller is structured to turn on the thyristor device in response to determining a second voltage measurement is greater than the thyristor voltage threshold.

3. The apparatus of claim 2, wherein the controller is structured to turn on the thyristor device also in response to determining the thyristor device is turned off and determining a current flowing through the FET-based branch is increasing.

4. The apparatus of claim 2, wherein the controller includes a voltage sensor structured to transmit a series of voltage measurements at a sampling rate, the series of voltage measurements including the first voltage measurement and the second voltage measurement.

5. The apparatus of claim 4, wherein the controller is structured to turn on the thyristor device by transmitting a gate pulse to the thyristor device, and wherein the updated thyristor threshold voltage is equal to a sum of a voltage margin and the voltage measurement of the series of voltage measurements taken after the gate pulse terminates.

6. The apparatus of claim 4, wherein the controller is structured to turn on the thyristor device by transmitting a gate pulse to the thyristor device, and wherein the controller updates the thyristor threshold voltage using the following equation, where $V_{TH}$ is the updated thyristor voltage threshold, $V_{AK}$ is the series of voltage measurements, n is an index number of the second voltage measurement, $T_{on}$ is a width of the gate pulse, $T_s$ is the sampling rate of the series of measurements, and $V_{margin}$ is a noise margin voltage:

$$V_{TH}=V_{AK}[n+(T_{on}/T_s)]+V_{margin}.$$

7. The apparatus of claim 1, wherein the controller is structured to turn off the thyristor device, and then turn on the thyristor device using the updated thyristor threshold voltage.

8. A method comprising:
   operating a thyristor-based branch including a thyristor device and a FET-based branch coupled in parallel with the thyristor-based branch and including a FET device;
   turning on the FET device;
   turning on the thyristor device after turning on the FET device based on a thyristor voltage threshold;
   receiving a voltage measurement measured while the thyristor device is turned on; and
   updating the thyristor voltage threshold based on the voltage measurement.

9. The method of claim 8, wherein turning on the thyristor device in response to determining a second voltage measurement is greater than the thyristor voltage threshold.

10. The method of claim 9, wherein turning on the thyristor device is also in response to determining the thyristor device is turned off and determining a current flowing through the FET-based branch is increasing.

11. The method of claim 9, further comprising operating a controller including a voltage sensor structured to transmit a series of voltage measurements at a sampling rate, the series of voltage measurements including the first voltage measurement and the second voltage measurement.

12. The method of claim 11, wherein turning on the thyristor device includes transmitting a gate pulse to the thyristor device, and wherein the updated thyristor threshold voltage is equal to a sum of a noise margin voltage and the voltage measurement of the series of voltage measurements taken after the gate pulse terminates.

13. The method of claim 11, wherein turning on the thyristor device includes transmitting a gate pulse to the thyristor device, and wherein updating the thyristor threshold voltage includes using the following equation, where $V_{TH}$ is the updated thyristor voltage threshold, $V_{AK}$ is the series of voltage measurements, n is an index number of the second voltage measurement, $T_{on}$ is a width of the gate pulse, $T_s$ is the sampling rate of the series of measurements, and $V_{margin}$ is a noise margin voltage:

$$V_{TH}=V_{AK}[n+(T_{on}/T_s)]+V_{margin}.$$

14. The method of claim 8, further comprising:
turning off the thyristor device; and
turning on the thyristor device using the updated thyristor threshold voltage.

15. A controller for a power switch including a FET device and a thyristor device, the controller comprising:
a voltage sensor structured to output a series of voltage measurements corresponding to a voltage of the thyristor device including a first voltage measurement; and
a processing device structured to execute a set of instructions effective to turn on the FET device, turn on the thyristor device after turning on the FET device based on a thyristor voltage threshold, update the thyristor voltage threshold based on the first voltage measurement measured while the thyristor device is turned on, turn off the thyristor device, and turn on the thyristor device using the updated thyristor threshold voltage.

16. The controller of claim 15, wherein the controller is structured to turn on the thyristor device in response to determining a second voltage measurement of the series of voltage measurements is greater than the thyristor voltage threshold.

17. The controller of claim 16, wherein the controller is structured to turn on the thyristor device also in response to determining the thyristor device is turned off and determining a current flowing through the FET device is increasing.

18. The controller of claim 16, wherein the controller is structured to turn on the thyristor device by transmitting a gate pulse to the thyristor device.

19. The controller of claim 18, wherein the updated thyristor threshold voltage is equal to a sum of a voltage margin and the voltage measurement of the series of voltage measurements taken after the gate pulse terminates.

20. The controller of claim 18, wherein the controller updates the thyristor threshold voltage using the following equation, where $V_{TH}$ is the updated thyristor voltage threshold, $V_{AK}$ is the series of voltage measurements, n is an index number of the second voltage measurement, $T_{on}$ is a width of the gate pulse, $T_s$ is the sampling rate of the series of measurements, and $V_{margin}$ is a noise margin voltage:

$$V_{TH}=V_{AK}[n+(T_{on}/T_s)]+V_{margin}.$$

\* \* \* \* \*